(12) United States Patent
Reinisch

(10) Patent No.: US 11,577,502 B2
(45) Date of Patent: Feb. 14, 2023

(54) PRINTING DEVICE

(71) Applicant: EKRA Automatisierungssysteme GmbH, Bönnigheim (DE)

(72) Inventor: Hubert Reinisch, Freiberg am Neckar (DE)

(73) Assignee: EKRA AUTOMATISIERUNGSSYSTEME GMBH, Bönnigheim (DE)

( * ) Notice: Subject to any disclaimer, the term of this patent is extended or adjusted under 35 U.S.C. 154(b) by 0 days.

(21) Appl. No.: 17/045,133

(22) PCT Filed: Mar. 28, 2019

(86) PCT No.: PCT/EP2019/057913
§ 371 (c)(1),
(2) Date: Dec. 2, 2020

(87) PCT Pub. No.: WO2019/192926
PCT Pub. Date: Oct. 10, 2019

(65) Prior Publication Data
US 2021/0146678 A1 May 20, 2021

(30) Foreign Application Priority Data
Apr. 5, 2018 (DE) ...................... 10 2018 205 157.7

(51) Int. Cl.
*B41F 15/26* (2006.01)
*B41F 15/14* (2006.01)
(Continued)

(52) U.S. Cl.
CPC .............. *B41F 15/26* (2013.01); *B41F 15/08* (2013.01); *B41F 15/14* (2013.01); *B41F 15/20* (2013.01);
(Continued)

(58) Field of Classification Search
CPC .......... B41F 15/26; B41F 15/08; B41F 15/14; B41F 15/18
(Continued)

(56) References Cited

U.S. PATENT DOCUMENTS 4,978,414 A * 12/1990 Ohtani .................... B41F 15/36
101/127.1
6,374,729 B1   4/2002 Doyle
(Continued)

FOREIGN PATENT DOCUMENTS

CN     100419589 C    9/2008
DE     196 45 760 A1  5/1998
(Continued)

OTHER PUBLICATIONS

International Search Report, dated Jul. 4, 2019 in International Application No. PCT/EP2019/057913.
(Continued)

*Primary Examiner* — Leslie J Evanisko
(74) *Attorney, Agent, or Firm* — Knobbe, Martens, Olson & Bear LLP

(57) ABSTRACT

A printing device for printing substrates, such as circuit boards, wafers, or solar cells, has at least one movably mounted printing unit with a working surface on which the substrate to be printed can be placed. The printing unit is paired with a transport belt device, which has a supply roller with a transport belt wound thereon, a collection roller for winding up the transport belt, and two deflecting surfaces, in particular deflecting rollers, which are paired with the working surface. The transport belt is guided by the supply roller over one deflecting surface and onto the working surface in order to form a contact surface for the substrates, and by the working surface over the other deflecting surface to the collection roller. The deflecting surfaces can be moved
(Continued)

together with the respective printing unit. The supply and collection rollers are held on the printing device in a stationary manner.

18 Claims, 2 Drawing Sheets

(51) Int. Cl.
  B41F 15/08 (2006.01)
  B41F 15/20 (2006.01)
  B41F 35/00 (2006.01)
(52) U.S. Cl.
  CPC .......... B41F 35/003 (2013.01); B41F 35/007 (2013.01); *B41P 2215/114* (2013.01); *B41P 2215/14* (2013.01)
(58) Field of Classification Search
  USPC ........................................................ 101/127
  See application file for complete search history.

(56) References Cited

U.S. PATENT DOCUMENTS

| | | | |
|---|---|---|---|
| 8,869,692 B2* | 10/2014 | Van Der Avoort | B65G 35/04 |
| | | | 101/126 |
| 9,555,646 B1 | 1/2017 | Gibb | |
| 2005/0284366 A1 | 12/2005 | Anderson | |
| 2006/0213417 A1* | 9/2006 | Codos | B41J 15/04 |
| | | | 112/475.08 |
| 2008/0034990 A1* | 2/2008 | Hilpert | H01L 21/67288 |
| | | | 101/126 |
| 2009/0260528 A1* | 10/2009 | Baccini | B08B 1/02 |
| | | | 101/126 |
| 2011/0020096 A1 | 1/2011 | Mink | |
| 2012/0244702 A1 | 9/2012 | Baccini et al. | |
| 2012/0288635 A1 | 11/2012 | Tanabe | |
| 2013/0052334 A1* | 2/2013 | Vercesi | H05K 3/1216 |
| | | | 118/712 |
| 2015/0003418 A1 | 1/2015 | Reichenbach | |
| 2017/0217193 A1 | 8/2017 | Kanemoto | |

FOREIGN PATENT DOCUMENTS

| | | |
|---|---|---|
| DE | 600 02 775 T2 | 5/2004 |
| DE | 10 2006 037 109 A1 | 2/2009 |
| DE | 10 2012 205 249 A1 | 10/2013 |
| DE | 10 2012 019 573 A1 | 3/2014 |
| DE | 10 2014 218 314 A1 | 3/2016 |
| EP | 0 535 399 A2 | 4/1993 |
| EP | 2 094 071 A2 | 8/2009 |
| EP | 2 711 183 A1 | 3/2014 |
| EP | 2 581 951 B1 | 6/2014 |
| JP | 4375221 B2 | 12/2009 |
| JP | 2017132043 A | 8/2017 |
| WO | WO 2008/120248 A1 | 10/2008 |
| WO | WO 2009/153160 A1 | 12/2009 |
| WO | WO 2014/080010 A1 | 5/2014 |
| WO | WO 2017/022127 A1 | 2/2017 |
| WO | WO 2019/192926 A1 | 10/2019 |
| WO | WO 2019/201886 A1 | 10/2019 |

OTHER PUBLICATIONS

International Search Report dated Jul. 18, 2019 in International Application No. PCT/EP2019/059734.
Examination Report dated Mar. 29, 2022 in Indian Application No. 202037043115.

* cited by examiner

PRINTING DEVICE

PRIORITY AND CROSS REFERENCE TO RELATED APPLICATIONS

This application is the U.S. National Phase Application under 35 U.S.C. § 371 of International Application No. PCT/EP2019/057913, filed Mar. 28, 2019, designating the U.S. and published as WO 2019/192926 A1 on Oct. 10, 2019, which claims the benefit of German Application No. DE 10 2018 205 157.7, filed Apr. 5, 2018. Any and all applications for which a foreign or a domestic priority is claimed is/are identified in the Application Data Sheet filed herewith and is/are hereby incorporated by reference in their entireties under 37 C.F.R. § 1.57.

FIELD

The invention relates to printing devices, in particular for printing on substrates such as circuit boards, wafers or solar cells.

BACKGROUND

Printing devices for printing on substrates are known from the prior art. For example, the publication DE 600 02 775 T2 discloses a printing device having a transport belt device for a printing unit, by means of which substrates can be fed to a print head and removed from the print head. For this purpose, the transport belt is routed under and past the print head over two deflecting surfaces. The transport belt device is part of the printing unit, which has a working surface over which the transport belt is drawn in order to position the substrates on the working surface and to support them during the processing. The printing unit is designed to be displaceable, for example in order to align the substrates with respect to the print head.

A printing unit for a printing device is known from the publication WO 2009/153160 A1, which has a transport belt device. The printing unit is movably arranged on a printing table and carries both the deflecting surface paired with the working surface and also a supply roller, from which the transport belt is unrolled, as well as a collection roller on which the transport belt is rolled up. The advantage of the transport belt is that the substrate can be moved to and aligned with the print head by means of the transport belt itself. In this case, it is also a transport belt that is not wound in an endless loop through the printing device, so that if the transport belt is soiled, the dirt is transported away with the transport belt into the collection roller and thereby removed from the printing device. This ensures that the printing device is kept clean in a simple manner. This applies in particular if the transport belt is designed to be air-permeable, such that a substrate on the printing unit is suctioned and locked in place on the working surface and/or the contact surface of the transport belt by the generation of a negative pressure below the working surface through the working surface and the transport belt, such that the printing process can be carried out reliably without additional retaining elements. Similar printing devices can also be found in the publications EP 2 581 951 B1, US 2013/0052334 A1 and US 2012/0244702 A1.

SUMMARY

The invention relates to a printing device, in particular for printing substrates such as circuit boards, wafers or solar cells, comprising at least one movably mounted printing unit with a working surface on which the substrate to be printed can be placed, wherein the printing unit is paired with a transport belt device that has a supply roller with a transport belt wound around it, and has a collection roller for winding up the transport belt, and two deflecting surfaces which are paired with the contact surface, wherein the transport belt is guided by the supply roller over one of the deflecting surfaces onto the working surface in order to form a contact surface for the substrates, and by the working surface over the other of the deflecting surfaces to the collection roller.

BRIEF DESCRIPTION OF THE DRAWINGS

The invention will be explained in more detail below with reference to the drawings, wherein.

DETAILED DESCRIPTION

Figure 1:
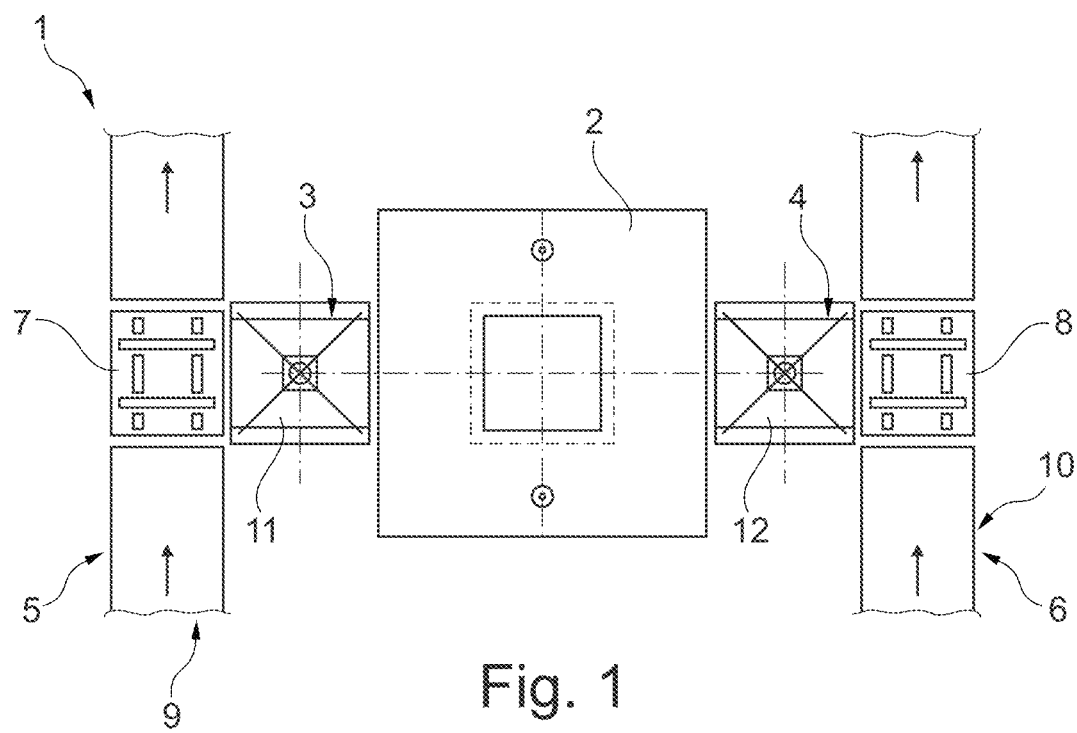
FIG. 1 is a simplified plan view of an advantageous printing device.

Due to the inertia of the disclosed printing units, the operating speed of the printing device is limited, or the weight of the printing units must be reduced with great material expenditures in order to reduce its inertia. However, this entails a corresponding additional expense, in particular if the robustness of the printing device is to be maintained. In particular, a high moving mass is created when the supply roller and/or collection roller have to be moved at the same time. The mass is further increased if large transport belt supplies on the supply roller are desired, with the aim of ensuring minimal maintenance interventions for changing the supply roller and collection roller, and the associated downtime of the entire production line.

An object of the invention is therefore that of creating a printing device which has a printing unit with reduced inertia, without the necessary material and cost inputs becoming uneconomical.

The object of the invention is achieved by a printing device, in particular for printing substrates such as circuit boards, wafers or solar cells, comprising at least one movably mounted printing unit with a working surface on which the substrate to be printed can be placed, wherein the printing unit is paired with a transport belt device which has a supply roller with a transport belt wound thereon, and has a collection roller for winding up the transport belt, as well as two deflecting surfaces, in particular deflecting rollers, paired with the working surface, wherein the transport belt is guided by the supply roller over one of the deflecting surfaces and onto the working surface in order to form a contact surface for the substrates, and by the working surface over the other deflecting surface to the collection roller, wherein the deflecting surfaces can be moved together with the respective printing unit, and the supply roller and the collection roller are held on the printing device in a stationary manner. This has the advantage that a simple rearrangement of the transport rollers of the transport belt device reduces the inertia of the printing unit. This makes use of the property of the transport belt that the path of the transport belt can also be changed easily during operation and without great additional effort or additional wear. According to the invention, the deflecting surfaces on the printing unit can be moved along with it, and the collection roller and the supply roller are held in a stationary manner on the printing device. The deflecting surfaces are, in particular, curved surfaces on the printing unit over which the end of the transport belt is pulled, bearing against the deflecting surfaces. The deflecting surfaces ensure low wear, and in particular a limited minimum deflection angle of the transport belt. According to a preferred embodiment, each deflecting surface is formed by a deflecting roller. The deflecting rollers are rotatably mounted on the printing unit, such that the wear due to friction between the transport belt and the respective deflecting surface is minimized. The deflecting rollers thus allow the transport belt to be easily deflected onto the working surface of the printing unit, and from the working surface to the collection roller. Due to the fact that they themselves store the transport belt or make it available and roll it up, respectively, the collection roller and the supply roller are designed to bear more load, and therefore have a relatively high weight compared to the deflecting surfaces or deflecting rollers. Due to the stationary arrangement of the collection roller and the supply roller, the parts of the transport belt device which lead to an increased weight of the printing unit are held outside the printing unit—specifically, stationary on the printing device—such that they are not moved as well when the printing unit is moved. Only the deflecting surfaces or rollers paired with the printing unit are moved. By relocating the relatively heavy collection roller and supply roller and thus the "transport belt storage," the inertia of the printing unit is considerably reduced. When the printing unit is moved, only the transport path of the transport belt changes, relative to the collection roller and supply roller. However, due to the conformability of the transport belt in the deflection direction, this does not impair the operation of the printing device. It is thus possible in a simple manner to reduce the inertia of the printing unit and thereby achieve an increased operating speed of the printing device, in particular an increased speed during movement of the printing unit, and thereby improve the throughput of the printing device.

According to a preferred development of the invention, the supply roller and the collection roller are arranged below the printing unit. As a result, the transport belt is guided from below over one deflecting surface, onto the working surface, and from the working surface over the other deflecting surface and back down to the collection roller. This makes it easy to exert a tension on the transport belt which ensures that the transport belt always runs flat over the contact surface and rests on it, thereby ensuring safe transport and positioning of the substrate(s) on the working surface. In addition, the supply roller and collection roller are then on the side of the printing device facing away from a print head, such that they do not require additional installation space on the side of the print head. In addition, this ensures that the transport belt can easily feed and remove substrates to and from the working surface.

Furthermore, the printing device preferably has a print head, and the printing unit is preferably displaceable between a processing position paired with the print head and a substrate exchange position paired with at least one feed- and/or removal device for the substrates. The printing unit can thus be conveyed to the print head in order to carry out a processing step, in particular a printing process, there, and also to the feed- and/or removal device in order to pick up and/or discharge at least one substrate. Due to the advantageous routing of the transport belt, the transport belt is moved together with the printing unit without the collection roller and supply roller being moved with it as well. The movement of the printing unit ensures a quick exchange of substrates for a processing step and/or printing process. Because the printing unit can be moved to a substrate exchange position, there is the possibility of feeding another printing unit to the print head during the time in which the printing unit is in the substrate exchange position, such that a printing process and a substrate exchange process can be carried out at the same time.

According to a preferred development of the invention, the printing unit is translationally displaceable in the plane. For this purpose, the printing unit is paired in particular with an actuator which moves the printing unit with an electric motor, electromagnetically, hydraulically and/or pneumatically. In particular, at least the processing position and the substrate exchange position lie in the same plane. Alternatively, the processing position and the substrate exchange position lie in different planes, wherein the processing position is higher than the substrate exchange position, for example, such that very minimal drops can be configured in the area below a print head. It is possible, for example, that the substrate to be printed is positioned within an adhesive screen edge of a printing screen of the print head by the movement of the printing unit. For moving the printing unit from one position to the other, it can be contemplated that the printing unit is shifted purely translationally, or is lifted into the other position and in so doing is moved out of the plane, for example along a curved path.

According to a preferred development of the invention, the transport belt device has at least one tensioning device between the supply roller and/or the collection roller and at least one of the deflecting surfaces, which acts on the transport belt to keep it tensioned, at least in the substrate exchange position. The tensioning device thus ensures that the transport belt is tensioned and does not become detached from the rollers or surfaces during operation, thereby ensuring that it always rests on the working surface in particular, and securely and precisely guides a substrate positioned on it. As a result, the transport belt always follows a predetermined path, such that damage and/or injuries are reliably avoided. In particular, the tensioning device is designed in such a way that the transport belt is slackened, or is only slightly tensioned, during the at least substantially horizontal movement of the printing unit, so as to allow for easy transport. In particular, only in the substrate exchange position does the tensioning device ensure that the belt is tensioned, in order to ensure reliable positioning, pick-up, and removal of the substrates. If the transport belt is only loosely tensioned, there is little risk of slippage between the transport belt and the substrate on the printing unit relative to one another.

According to a preferred embodiment, the tensioning device has at least one tensioning roller which is preloaded against the transport belt between the collection roller or the supply roller and the at least one deflecting surface or roller. The tensioning roller thus exerts an additional force on the transport belt, by means of which the transport belt is tensioned, and is ensured against the deflecting surface or deflecting roller, and collection roller and supply roller.

The tensioning roller is preferably preloaded against the transport belt by spring force, such that permanent tensioning of the transport belt is automatically ensured without additional active influence. In particular, the tensioning device has a tensioning roller that acts between the supply roller and one of the deflecting surfaces or rollers, and a further tensioning roller that is preloaded against the transport belt between the collection roller and the other deflecting surface or roller. This ensures secure transport of the transport belt in every case, especially when the printing unit is moved.

According to a preferred development, the transport belt device has at least one movably mounted deflecting surface, in particular a deflecting roller, which works together with the transport belt, and has a controllable actuator for moving the deflecting surface. This enables the transport belt to be actively tensioned or slackened by moving the movably mounted deflecting surface. As a result, by way of example, even larger movement paths of the printing unit can be varied by enlarging or reducing the transport belt path from the supply roller onto the working surface or from the working surface to the collection roller. This also reliably ensures that the transport belt is securely fed and taken when the printing units produce larger movements.

The transport belt device preferably has two first guide tensioner rollers between the supply roller and one of the deflecting rollers, and/or two second guide tensioning rollers between the collection roller and the other deflecting roller, in each case as seen in the path of movement of the transport belt, wherein the displaceable deflecting roller of the transport belt tensioning device is displaceable, in particular linearly and in particular horizontally, in particular at a level between the first guide tensioning rollers and the second guide tensioning rollers. The guide tensioning rollers and the deflecting rollers can also be designed as non-rotatable deflection tensioning surfaces or deflecting surfaces. Because the transport belt also works together with the displaceable deflecting roller, the result is that the transport belt is drawn out laterally and/or is deflected between the two first or second guide tensioning rollers by the displaceable deflecting roller. The transport path for the transport belt between the supply roller and the working surface or between the working surface and the collection roller is shortened or lengthened according to the extent to which it is drawn out. As a result, it is possible to actively refeed or retighten the transport belt when the printing unit is moved, which allows optimized operation of the printing device. Two displaceable deflecting rollers are particularly preferably provided, wherein one deflecting roller is paired with the supply roller and the other deflecting roller is paired with the collection roller, and each of these is positioned at the level between the first guide tensioning rollers and the second guide tensioning rollers. The deflecting rollers are preferably horizontally displaceable; however, a different direction of displacement can also be contemplated. The displaceable deflecting rollers are preferably fastened to a single carrier element, which is in particular horizontally displaceable and with which the controllable actuator for moving the deflecting rollers is paired. Because the deflecting rollers can be displaced between the first and second guide tensioning rollers, the transport belt moves over the working surface; in other words, a transport belt advancement is initiated without the supply roller and collection roller needing to rotate for this purpose. By moving the carrier element, which is designed in particular as a carriage, one of the deflecting rollers releases the transport belt when it is moved, and the other deflecting roller takes up the released transport belt—for example, as occurs in a pulley block. As a result, the transport belt with the substrate lying on it is moved and/or conveyed, even though the supply roller and collection roller are stationary. This further reduces the moving inertial mass and enables an even higher throughput of the printing device. In this case, the transport belt is not exchanged because the transport belt section which is initially resting on the working surface comes to rest once again in its original position on the working surface after the return movement of the carrier element. This ensures a faster advance and return of the transport belt for the substrate exchange which occurs in synchrony with the machine cycle. In the event that the transport belt is dirty, the supply roller and collection roller are driven in such a manner that fresh transport belt, or previously unused transport belt, is introduced into the feed. In a "normal" operation of the printing device, at a cycle speed of 1000 µs, by way of example, and if there is no dirty transport belt section which needs to be replaced with a fresh transport belt section, the heavy supply rollers and collection rollers do not rotate/move, which means that the moving mass is particularly low during operation.

According to a preferred further development of the invention, the supply roller and the collection roller are each arranged offset laterally and/or vertically relative to the deflecting surfaces or rollers of the printing unit in the processing position and in the substrate exchange position. This offset is relative to the axes of rotation of the supply roller and the collection roller, as well as a central axis of the deflecting surfaces of the printing unit in the processing position and in the substrate exchange position. The axes are not directly above each other vertically; rather, they are offset from each other. This ensures that the transport belt is relaxed when in the processing position of the printing unit, and is tensioned when in the substrate exchange position. In the path between the processing position and the substrate exchange position, the transport belt is preferably also relaxed, such that the substrate is not displaced on the printing unit and can be conveyed without delay in the substrate exchange position. In particular, the axes of rotation are arranged at a slight distance from a central axis of the given printing unit deflector in the processing position and in the substrate exchange position. According to a first embodiment, the printing unit lies substantially above the supply roller in the processing position and substantially above the collection roller in the substrate exchange position. A second embodiment provides a reverse design.

The transport belt device preferably has a verification device for contactless detection of transport belt contamination. For this purpose, the verification device has, for example, a camera sensor which detects the surface of the transport belt on which the given substrate is placed for processing, and monitors it for contamination or soiling by means of an image evaluation. If, for example, it is recognized that the transport belt is not or is barely soiled, the transport belt can be moved back and used again. If soiling is detected which exceeds a prespecifiable threshold value, the transport belt is further rolled up onto the collection roller, and unrolled from the supply roller, such that clean and/or unsoiled transport belt is available for the next processing operation and/or for the next substrate.

The verification device is preferably arranged on the printing device in such a way that it is opposite the transport belt running between the other deflecting roller and the collection roller in the substrate exchange position of the printing unit. To this extent, the verification device is arranged in a stationary manner on the printing device. Instead of bringing the verification device closer to the transport belt, the transport belt is brought closer to the verification device when the printing unit is moved into the substrate exchange position. This ensures simple and reliable detection of the contamination access of the transport belt after a processing step or printing process has taken place.

According to an advantageous development, there is a cleaning device for removing protection from the transport belt. The cleaning device is designed, for example, as a suction device which suctions dirt on the surface of the transport belt off of the transport belt. This means that the transport belt can be used multiple times even after it has been soiled.

In particular, the cleaning device is arranged on the printing device in such a way that it is opposite the transport belt running between the other deflecting surface or deflecting roller and the collection roller in the substrate exchange position of the printing unit. As a result, the cleaning device lies opposite the portion of the transport belt which was previously used for a processing step and which has already been transported away from the working surface in the direction of the collection roller due to the removal of the substrate to the removal/supply device. An additional movement of the transport belt solely for cleaning and verification purposes is therefore not necessary; and a particularly time-saving verification and, if necessary, cleaning process is performed.

The transport belt is preferably designed as a paper web, film web, or plastic vacuum belt. In particular, the paper web and the plastic vacuum belt have the advantage that substrates situated on the transport belt can be locked easily and securely on the transport belt by generating a vacuum on the side of the transport belt facing away from the substrates, especially for carrying out the printing process.

The printing device particularly preferably has two displaceable printing units which are designed as described above and in this respect each have a transport device, wherein the printing units can be moved alternately into the processing position paired with the print head. This means that the printing units share the same print head, and/or a plurality of printing units are alternately fed to the single print head. As a result, during the processing of a substrate and/or when a substrate is being printed on one printing unit, an exchange process can be carried out by the other printing unit. As a result, the downtimes of the printing device are particularly short, and a high throughput of the printing device is ensured.

Particularly preferably, each printing unit is paired with its own feed- and removal device for the substrates. This ensures the simultaneous processing and supply and/or removal of the substrates, and the aforementioned high throughput can be achieved.

Particularly preferably, each of the feed- and removal devices has a feed conveyor belt and a removal conveyor belt, which lie one above the other and are adjustable in height. Depending on which of the two conveyor belts is at the level of the printing unit, in particular the working surface of the printing unit, in the substrate exchange position, a substrate can be fed to the printing unit or removed from the printing unit to the removal conveyor belt. This enables a quick change and a quick exchange of substrates on the respective printing unit, in particular while a printing process is being carried out on the at least one further printing unit. Of course, there can be fewer or more than just two printing units. For example, it is conceivable for the printing device to have four displaceable printing units, as described above, which are arranged in the same plane and are displaceable on four different sides of the print head. In this case, each printing unit is preferably paired with its own feed- and removal device for substrates. In particular, each feed conveyor belt and removal conveyor belt are arranged on the same, height-adjustable holder, such that the feeding and the removal of the substrates can be performed easily by just a few actuators.

Particularly preferably, each printing unit in its substrate exchange position is paired with at least one sensor, in particular a camera sensor, of an adjusting device used for detecting and correcting a position and/or orientation of at least one substrate situated on the printing unit. This makes it possible for the adjusting device to correct the position and/or orientation of the given substrate, in particular relative to the print head, in order to carry out an optimal printing process. In this case, for example, the print head alignment or a correction of the orientation of the given printing unit can be carried out during the horizontal movement of the printing unit.

Further advantages and preferred features and combinations of features emerge from what has been described above and from the claims.

FIG. 1 shows, in a simplified plan view, an advantageous printing device 1 which has a print head 2 which is designed, for example, as a screen printing device. Two printing units 3, 4 are paired with the print head 2 and can be conveyed to the print head 2 alternately. Each printing unit 3, 4 is also paired with a feed- and removal device 5, 6 that is used to feed substrates to be printed to the respective printing unit 3, 4, and to remove substrates printed by the print head 2 from the respective printing unit 3, 4. According to the present exemplary embodiment, each feed- and removal device 5, 6 has a conveyor track 9 or 10 interrupted by a handling device 7, 8, along which substrates can be conveyed—as indicated by the arrows. The handling unit 7, 8 is designed to convey a substrate conveyed along the conveyor track 9, 10 onto the printing unit 3, 4 located next to the conveyor track 9, 10, and thus make it available for the printing process. Once the printing process is complete, the substrate is conveyed back from the printing unit 3, 4 to the respective handling unit 7, 8, and from there is further conveyed along the conveyor track, for example for further processing or testing. The feed and removal of the substrates to and/or from the handling unit 7, 8 can also take place from only one operating side, for example only from above in the illustration in FIG. 1. The supply and removal of the substrates from only one operating side is advantageous in particular for reasons of good accessibility from one side, for example from the rear of the machine, that is to say from the side of the printing device facing away from the operating side. For example, if there is only one operating side, the rear of the machine is always accessible for maintenance and/or adjustment purposes. For this purpose, there are, for example, two transport belts adjacent to each other or one on top of the other and leading past the printing device, each of which has a transverse belt for the feed from or removal to the handling unit 7, 8, wherein the transverse belts of the conveyor belt that are on the side of the other transport belt facing away from the printing device run above or below the transport belt situated between them.

For conveying and orienting the substrates on the printing units 3, 4, each of the same are equipped with their own transport belt 11, 12 which extends transverse to the conveying direction of the conveyor belts 9, 10, and is movable.

Figure 2:
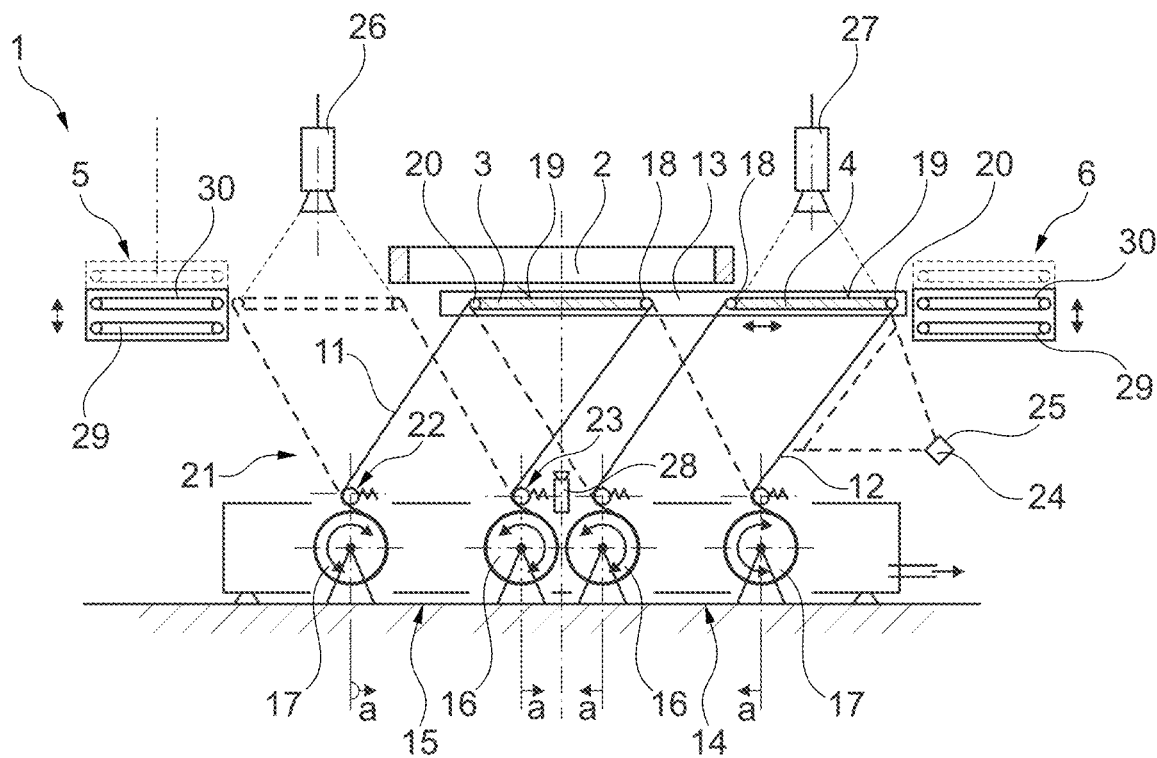
FIG. 2 shows a simplified side view of the printing device.

FIG. 2 shows a simplified side view of the printing device 1. FIG. 2 also shows an alternative embodiment of the feed- and removal devices 5, 6, which will be discussed in more detail below.

Each of the printing units 3, 4 can be horizontally displaced horizontally between a processing position paired with the print head 2 and a substrate exchange position paired with the respective feed- and removal device 5, 6.

According to the embodiment of FIG. 2, the printing unit 3 is in the processing position and the printing unit 4 is in the substrate exchange position (each shown by solid lines). The printing unit 3 in the substrate exchange position paired with it and the printing unit 4 in the processing position are also shown in dashed lines.

The printing units 3, 4 are arranged on a frame 13 which is at least substantially horizontally movable in order to move both printing units 3, 4 at the same time. According to a further embodiment not shown here, the printing units 3, 4 are mounted so as to be at least substantially horizontally displaceable independently of one another.

As mentioned above, each of the printing units 3, 4 is paired with a transport belt 11 and 12, respectively. Each of the transport belts 11, 12 is a part of one transport belt device 14, 15.

Each of the transport belt devices 14, 15 has a supply roller 16 on which the transport belt 11 or 12 is mounted. This roll is rotatably mounted in a stationary manner on the printing device 1. Furthermore, the respective transport belt device 14, 15 has a collection roller 17, which serves to roll up and collect the transport belt 11, 12 unrolled from the supply roller 16. It is therefore not an endless belt, but rather a finite transport belt which is unrolled from the supply roller 16 and rolled up by the collection roller 17. However, the supply roller 16 and collection roller 17 can also be operated in reverse, such that already rolled up transport belt is unrolled from the collection roller 17 and rolled up onto the supply roller 16, in order to provide for a return transport or reuse of a section of the transport belt that has already been used for a printing process—as shown, for example, by double arrows on the rollers 16, 17. The path of movement of the transport belt in this case runs from the transport roller 16 over a deflecting roller 18 situated on a first terminal edge of a working surface 19 of the given printing unit 3 or 4, past the working surface 3, and to a further deflecting roller 20 situated on the side facing away from the deflecting roller 18, and/or on the terminal edge of the working surface 19, and from there to the collection roller 17. The deflecting rollers 18, 20 are rotatably mounted and their axes of rotation are parallel to each other and parallel to the axes of rotation of the supply roller 16 and the collection roller 17, thereby ensuring a low-wear transport of the transport belt 11 or 12. A tensioning device 21 is also arranged, for each printing unit 3, 4, between the stationary rollers 16, 17 and the deflecting rollers 18, 20 which move together with their respective printing units 3. This ensures that the transport belt 11 or 12 is tensioned at least in the substrate exchange position. For this purpose, according to the present exemplary embodiment, the tensioning device 21 has a first spring-preloaded tensioning roller 22 which is connected in the conveying direction downstream of the supply roller 16 and upstream of the deflecting roller 18, and a second spring-preloaded tensioning roller 23, which is connected downstream of the deflecting roller 20 and upstream of the collection roller 17. Both of the tensioning rollers 20, 23 are preloaded by spring force in such a way that they deflect the transport belt 11 laterally, such that it does not follow the shortest path from the tensioning roller 16 to the deflecting roller 18 and/or from the deflecting roller 20 to the collection roller 23, but rather follows an elongated path produced by the deflection of the respective tension roller 22, 23.

Furthermore, the axes of rotation of the supply roller 16 and the collection roller 17 are arranged in relation to the given printing unit 3, 4 and the processing position, as well as the substrate exchange position, in such a manner that the axes of rotation are offset by a distance a from a central axis of the printing unit 3 and/or 4 in the processing position, and also in the substrate exchange position. In relation to the printing unit 3, the axis of rotation of the collection roller 17 is therefore eccentric to the central axis of the printing unit 3 in the substrate exchange position (shown in dashed lines) and the processing position, and the supply roller 16 is offset from the central axis of the printing unit 3 between the processing position and the substrate exchange position, relative to the given deflection at the printing unit 3. For the printing unit 4, the same applies accordingly; supply roller 16 is situated below the printing unit 4 in the processing position, but with its axis of rotation offset to the center axis of the two positions of the deflecting roller 19 of the printing unit 4, and the collection roller 17 is accordingly situated below the printing unit 4 in the substrate exchange position (solid lines), but with its axis of rotation offset from the center axis of the two positions of the deflecting roller 20 of the printing unit 4.

The fact that the supply rollers 16 are situated in the region of the print head 2 ensures that when the supply roller is unrolled, the transport belt is moved outward in the direction of the respective feed- and removal device 5, 6, such that, due to the transport of the given substrate from the given printing unit 3, 4 in the direction of the feed- and removal device 5, 6, the transport belt 11 is automatically further conveyed, and is unrolled from the supply roller 16 and rolled up on the collection roller 17, such that new transport belt 11 comes onto the working surface 19 for the next processing step, while potentially soiled transport belt has been conveyed away.

In normal operation, a substrate is then first positioned on the printing unit 4 by the feed- and removal device 6 and the movement of the transport belt 12. The frame 13 is then moved at least substantially horizontally in the direction of the feed- and removal device 5, thereby moving the printing unit 3 into the substrate exchange position and the printing unit 4 into the processing position below the print head 2. While a printing process is then carried out by means of the print head on the substrate lying on the printing unit 4, in particular by means of screen printing or stencil printing, a substrate is conveyed to the printing unit 3 by the feed- and removal device 5, optionally with the assistance of the movement of the transport belt 11. When the printing process on the printing unit 4 is complete, the frame 13 is shifted back into the previous position, thereby moving the printing unit 4 into its substrate exchange position and the printing unit 3 into the processing position below the print head 2. The substrate situated on the printing unit 3 is then printed by the print head 2, while the printed substrate on the printing unit 4 is conveyed away in the direction of the feed- and removal device 6. For this purpose, the transport belt 12 is rolled up by the collection roller 17, as a result of which the substrate is conveyed in the direction of the feed- and removal device 6. Each of the transport belts 11, 12 is particularly air-permeable, such that a vacuum can be generated in the region of the printing device 2 by a vacuum device. This vacuum suctions substrates located on the transport belt 12 in the region of the working surface 19 against the printing unit 3 or 4, and thereby locks them in place for the printing process.

The transport belt 12 involved in the printing process, and/or the portion that rests on the working surface 19 during the printing process, is now moved over the deflecting roller 20 of the printing unit 4 in the direction of the collection roller 17. The distance between the deflecting roller 20 and the collection roller 17 is optionally selected in this case in such a manner that it is at least as large as the distance between the deflecting rollers 18 and 20, such that the portion used during the printing process is completely situated in the region between the deflecting roller 20 and the second tensioning roller 23. A verification device 24 is optionally paired with this portion, and in particular has a camera sensor 25, by means of which the degree of soiling of the surface of the transport belt 11 can be detected. In the substrate exchange position, the transport belt is opposite the verification device 24. A corresponding verification device 24 is preferably also arranged on the side of the printing unit 3, and interacts with the transport belt 11 in a corresponding manner, in order to check the soiling thereof after a printing process has been carried out. Because the transport belt 12 has already been moved in the direction of the collection roller 24 and thus in the detection area of the verification device 24 by the transport of the substrate from the printing unit 3, 4 to the feed- and removal device 5, 6, it is not necessary to repeat a movement of the transport belt solely for the verification of the degree of soiling.

If it is recognized that the degree of soiling is low, the transport belt 12 is preferably conveyed back onto the working surface 19 of the printing unit 4 together with the feed of the next substrate, in order to be available for a new printing process. This prevents premature consumption of the transport belt 12. However, if the verification device 24 detects that the transport belt 12 has a contamination that exceeds a prespecified threshold value, the transport belt 12 is transported far enough that a fresh, as yet unused section of the transport belt 12 is available for receiving a further substrate. The same procedure is followed with the transport belt 11.

To optimize the printing process, the substrate exchange positions of the printing unit 4 and the printing unit 3 are each paired with a camera device 26, 27, which is part of an adjustment device which detects the orientation and arrangement of the, or possibly a plurality of, substrates placed on the given printing unit 3, 4 and, if necessary, optionally corrects the orientation and position relative at least to the print head 2 and printing units 3, 4 by means of the adjustment device, in order to be able to carry out an optimal printing process by the print head 2. To correct the orientation and/or position, the print head 2 and/or the given printing unit 3, 4 is/are preferably adjusted, in particular as a function of the signals provided by the camera device 26, 27.

Because the supply rollers 16 and the collection rollers 17 are arranged in a stationary manner on the printing device 1, the printing units 3, 4 have a particularly low weight and thus a particularly low inertia, which enables the printing units 3, 4 to be moved quickly. This ensures a high throughput of substrates by means of the printing device 1.

A further camera device 28 which monitors the correct positioning of the printing units 3, 4 below the print head 2 is also preferably paired with the processing position of the printing units 3, 4.

Whereas, according to the exemplary embodiment of FIG. 1, the substrates are supplied or removed by the given conveyor track 9, 10 by means of the handling unit 7, 8, according to the exemplary embodiment of FIG. 2, each of the feed- and removal devices 5, 6 is two-tiered, and has a first transport belt 29 for the feed of substrates and a second transport belt 30 located above it for the removal of substrates. The height of the transport belts 29, 30 is adjustable in this case, as indicated by a double arrow in FIG. 2, in order to enable either the feeding transport belt 29 to transfer a substrate to the respective printing unit 3, 4 in the substrate exchange position, or the transport belts 29, 30 are shifted downward such that the transport belt 30 is at the level of the printing unit 3 or 4, for removing a substrate, thereby ensuring easy movement of the substrate from the printing unit 3 onto the transport belt 30 for further transport.

Figure 3:
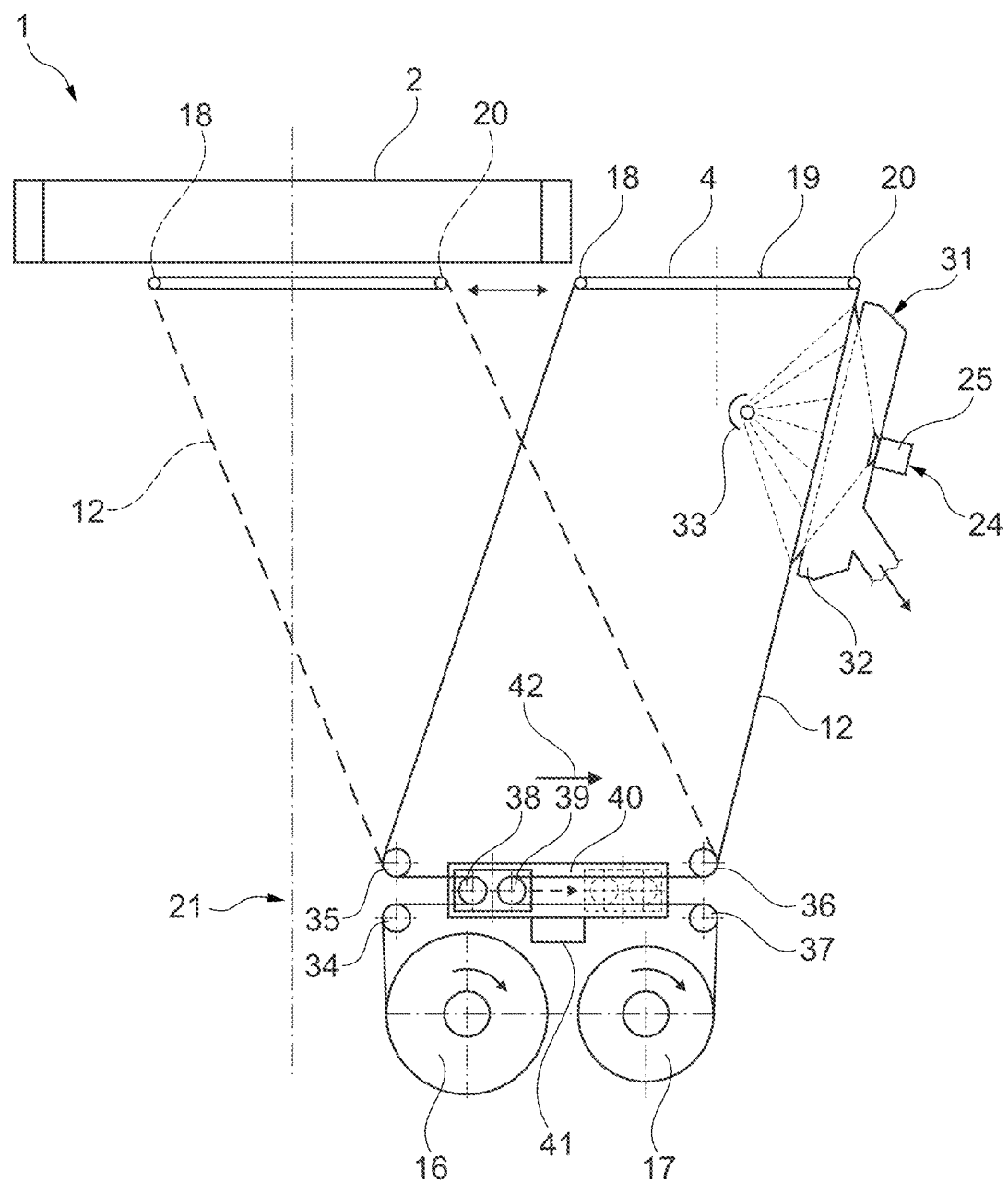
FIG. 3 shows a further side view of the printing device according to a further example embodiment.

FIG. 3 shows a further exemplary embodiment of the printing device 1, wherein only the printing unit 4 is shown in this exemplary embodiment; the printing unit 3 is preferably designed to correspond thereto. Of course, the printing device 1 can also have only one of the two printing units 3 or 4. It is likewise possible for the printing device 1 to have more than two printing units 3, 4, which are then in particular displaceable independently of each other.

The exemplary embodiment of FIG. 3 differs from the exemplary embodiment of FIG. 2 in that a cleaning device 31 is present in addition to the verification device 24 with the camera sensor 25. The cleaning device 31 has, in particular, a suction device 32 which covers the transport belt 12 in the substrate exchange position of the printing unit 4 at least in some sections thereof, in order to suction off and remove dirt particles or printing residues from the surface of the transport belt 12 by means of a vacuum, such that this portion of the transport belt 12 is made usable for a further printing process. Optionally, a compressed air device 33 acts on the rear side of the transport belt 12 in order to simplify the separation of dirt or printing residues from the transport belt 12. Optionally, a light source is also paired with the transport belt, and illuminates the transport belt 12 from the side in order to support the soiling verification by means of back light.

The exemplary embodiment of FIG. 3 differs from the preceding exemplary embodiment in another feature, which can be present independently of the cleaning device 31, and which is a special embodiment of the tensioning device 21. In this case, the tensioning device 21 is formed by four fixed guide tensioning rollers 34, 35, 36 and 37 and two displaceable deflecting rollers 38 and 39.

The guide tensioning rollers 34, 38 and 35 deflect the transport belt 12 laterally on the path from the supply roller 16 to the deflecting roller 18, and the guide tensioning rollers 36, 37 and 39 deflect the transport belt 12 on the path from the deflecting roller 20 to the collection roller 17.

For this purpose, the deflecting rollers 34 and 35 and the deflecting rollers 36 and 37 are each fixed at a distance from each other or are superimposed for a tensioning and guiding function of the transport belt 12. Each of these deflecting rollers 38 and 39 lies at the level between the deflecting rollers 34, 35 and 36, 37, such that the transport belt is deflected laterally by the deflecting rollers 38, 39. The deflecting rollers 39, 38 accordingly elongate the transport path of the transport belt 12. The deflecting rollers 38, 39 are rotatably mounted on the same carrier element 40, in particular a carriage, which can be moved horizontally by an actuator 41. This movement elongates the path of the transport belt 12 from the supply roller 16 to deflecting roller 18, and at the same time shortens the path from the deflecting roller 20 to the collection roller 17, in accordance with the arrow 42. This allows for actively influencing the transport belt tension, and in particular the transport belt portions between the supply roller 16 and the deflecting roller 18 and/or the deflecting roller 20 and the collection roller 17. As a result, the supply roller 16 and the collection roller 17 do not have to be driven for transporting the transport belt 12 along the working surface 19 of the printing unit 4, and can instead come to a standstill. The movement of the carriage and/or the carrier element 40 alone moves the transport belt 12 over the working surface, thereby, by way of example, supplying a substrate to the feed- and removal device 6 or removing the substrate from it.

The options for the printing unit 4 described with reference to FIG. 3 are preferably also provided for the printing unit 3 or any further printing unit of the printing device 1, and thus for the each of the associated transport belts 11 and/or the associated transport belt devices 15.

Although in the present exemplary embodiments the deflecting rollers 18, 20, 22, 23, 34-39 are always designed as rotatably mounted rollers, according to a further exemplary embodiment, which is not shown here, instead of the movable deflecting rollers fixed deflecting surfaces are formed, for example, on each of the printing units 3, 4, the curvature of which corresponds, for example, to the curvature of the rollers. By providing deflecting surfaces instead of deflecting rollers, the weight of the printing units 3, 4 is further reduced.

The invention claimed is:

1. A printing device comprising:
    at least one movably mounted printing unit, wherein the printing unit comprises a working surface, wherein substrates to be printed are placeable on the working surface;
    a transport belt device, wherein the transport belt device comprises:
        a transport belt;
        a supply roller with the transport belt wound thereon, a collection roller for winding up the transport belt, and two deflecting surfaces formed by deflecting rollers,
    a print head having an associated processing position; and
    a feed or removal device having an associated substrate exchange position,
    wherein the transport belt is configured to be guided by the supply roller over one of the deflecting surfaces and onto the working surface in order to form a contact surface for the substrates, and wherein the transport belt is configured to be guided by the working surface over an other of the deflecting surfaces to the collection roller,
    wherein the deflecting surfaces are moveable together with the respective printing unit between the processing position and the substrate exchange position, and wherein the supply roller and the collection roller are held on the printing device in a stationary manner.

2. The printing device according to claim 1, wherein the supply roller and the collection roller are arranged below the printing unit.

3. The printing device according to claim 1, wherein the printing unit is at least substantially displaceable in a horizontal plane.

4. The printing device according to claim 1, wherein the transport belt device has at least one tensioning device, between the supply roller and/or the collection roller and at least one of the deflecting rollers, which is configured to act on the transport belt to keep the transport belt tensioned at least in the substrate exchange position.

5. The printing device according to claim 4, wherein the tensioning device has at least one tensioning roller which is preloaded against the transport belt between the collection roller or the supply roller and the at least one deflecting roller.

6. The printing device according to claim 5, wherein each of the tensioning rollers is preloaded by spring force against the transport belt.

7. The printing device according to claim 1, wherein the transport belt device has at least one movably mounted deflecting roller which works together with the transport belt, and has a controllable actuator to move the deflecting roller.

8. The printing device according to claim 7, wherein the transport belt device has two first guide tensioning rollers between the supply roller and one of the deflecting rollers and/or two second guide tensioning rollers between the deflecting roller and the collection roller, wherein the at least one movably mounted deflecting roller is displaceable between the first guide tensioning rollers and/or the second guide tensioning rollers.

9. The printing device according to claim 1, wherein the supply roller and the collection roller are each arranged vertically offset from the deflecting surfaces of the printing unit in the processing position and in the substrate exchange position.

10. The printing device according to claim 1, wherein the transport belt device has a verification device for contactless detection of transport belt contamination.

11. The printing device according to claim 10, wherein the verification device is arranged on the printing device in such a manner that the verification device is opposite the transport belt running between the other deflecting surface and the collection roller in the substrate exchange position of the printing unit.

12. The printing device according to claim 1, wherein a cleaning device is included for removing dirt from the transport belt.

13. The printing device according to claim 12, wherein the cleaning device is arranged on the printing device in such a manner that the cleaning device is opposite the transport belt running between the other deflecting roller and the collection roller in the substrate exchange position of the printing unit.

14. The printing device according to claim 1, wherein the transport belt is designed as a paper web, film web, or plastic vacuum belt.

15. The printing device according to claim 1, wherein the printing device has two displaceable printing units, wherein each of the printing units is paired with a transport belt device, wherein the printing units are alternately moveable into the processing position paired with the print head.

16. The printing device according to claim 15, wherein the printing device comprises two feed and removal devices for the substrates, and wherein each of the printing units is paired with one of the feed and removal devices.

17. The printing device according to claim 16, wherein each of the feed and removal devices has a feed conveyor belt and a removal conveyor belt, and wherein the corresponding feed conveyor belt and the corresponding removal conveyor belt lie one above the other and are adjustable in height.

18. The printing device according to claim 17, wherein the corresponding feed conveyor belt and the corresponding removal conveyor belt are arranged on a single, height-adjustable holder.

* * * * *